(12) United States Patent
Sidiropoulos et al.

(10) Patent No.: US 6,573,779 B2
(45) Date of Patent: Jun. 3, 2003

(54) DUTY CYCLE INTEGRATOR WITH TRACKING COMMON MODE FEEDBACK CONTROL

(75) Inventors: Stefanos Sidiropoulos, Palo Alto, CA (US); Yingxuan Li, Cupertino, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/865,615

(22) Filed: May 25, 2001

(65) Prior Publication Data

US 2002/0175739 A1 Nov. 28, 2002

(51) Int. Cl.[7] .............................. G06F 7/64; G06G 7/18
(52) U.S. Cl. ........................................ 327/345; 330/260
(58) Field of Search ........................... 327/345, 52, 54, 327/56, 65, 67, 82, 85, 87–90, 175, 176, 246, 247; 330/258–260

(56) References Cited

U.S. PATENT DOCUMENTS

| | | | | |
|---|---|---|---|---|
| 5,422,529 | A | | 6/1995 | Lee .............................. 327/536 |
| 5,451,898 | A | | 9/1995 | Johnson ....................... 327/563 |
| 5,914,638 | A | * | 6/1999 | He ................................ 327/96 |
| 6,281,751 | B1 | * | 8/2001 | Maulik ......................... 330/255 |
| 6,326,846 | B1 | * | 12/2001 | Brandt ......................... 330/253 |
| 6,356,152 | B1 | * | 3/2002 | Jezdic et al. ................. 330/253 |
| 6,359,510 | B1 | * | 3/2002 | Ishii et al. ................... 330/253 |
| 6,384,653 | B1 | * | 5/2002 | Broome ....................... 327/131 |

* cited by examiner

Primary Examiner—My-Trang Nu Ton
(74) Attorney, Agent, or Firm—Lee & Hayes, PLLC (57) ABSTRACT

Disclosed herein is a process-tracking clock duty cycle integrator. Common mode feedback is used to set a common mode output voltage that varies with the voltage threshold of MOS elements that implement the circuit. In addition, a buffer is used to control the common mode input voltage to the differential amplifier circuit, and to vary the common mode input voltage with the voltage threshold.

35 Claims, 4 Drawing Sheets

Fig. 5

DUTY CYCLE INTEGRATOR WITH TRACKING COMMON MODE FEEDBACK CONTROL

TECHNICAL FIELD

This invention relates to differential amplifiers and to clock duty cycle integrators.

BACKGROUND

Differential amplifiers are used for a variety of purposes. One use of a differential amplifier is in a circuit that measures and corrects for duty cycle error in a clock signal.

A clock is typically desired to have a 50% duty cycle. A duty cycle integrator is used to produce a differential output voltage that represents the integral of the duty cycle error on a clock signal over time. That voltage is then used to correct the duty cycle of the signal back to 50%.

Figure 1:
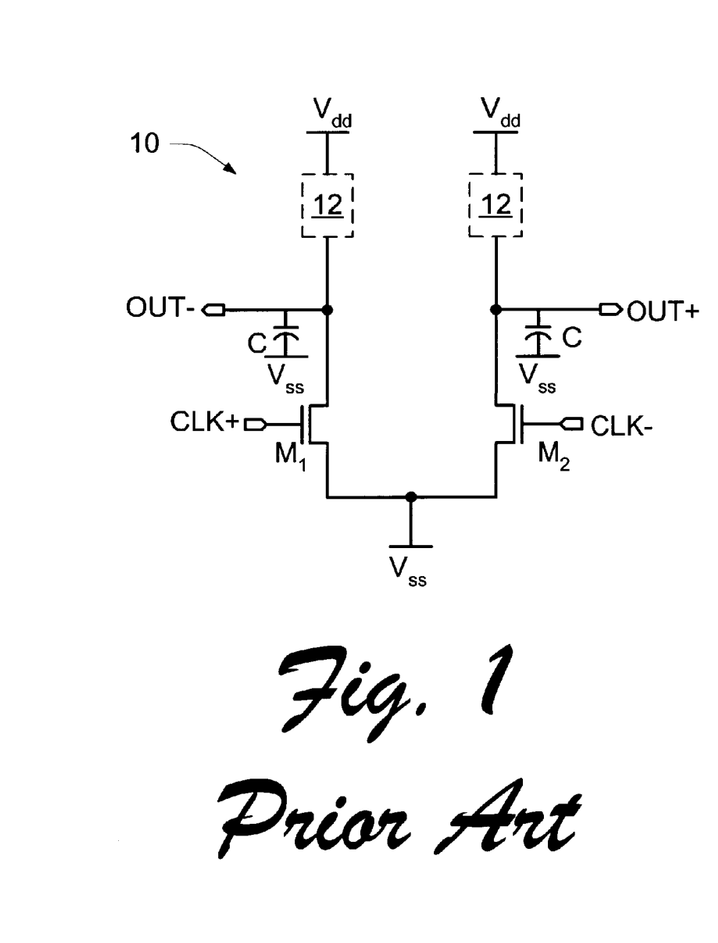
FIGS. 1 and 2 are schematic diagrams of prior art clock duty cycle integrators.

FIG. 1 shows a simplified prior art duty cycle integrator 10. As input, the duty cycle integrator accepts complementary clock inputs CLK+ and CLK−, and produces a differential output voltage on nodes OUT+ and OUT−.

Duty cycle integrator 10 comprises a differential pair of transistors $M_1$ and $M_2$. The transistors in this example are n-channel MOSFETs whose sources are connected in common to a lower supply voltage $V_{ss}$. The drain of each transistor is connected to an upper supply voltage $V_{dd}$ through a load circuit 12. The load circuit typically provides a bias and preferably exhibits high differential mode impedance to facilitate integration of the duty cycle error.

A capacitance C is connected to integrate the output current and generate voltages OUT+ and OUT−.

The gates of transistor $M_1$ and $M_2$ receive the complementary clock inputs CLK+ and CLK−, and the transistors switch on and off in response. Because of the complementary nature of the clock inputs, one transistor is on while the other is off. If there is a 50% duty cycle, each transistor is on for same duration, and the integrated outputs equal each other. If there is other than a 50% duty cycle, however, one of the transistors is on for longer durations than the other transistor. Over time, this causes the integrated outputs OUT+ and OUT− to become unequal, producing a differential signal. The rate of change of that differential signal is indicative of the duty cycle error on the clock inputs.

Figure 2:
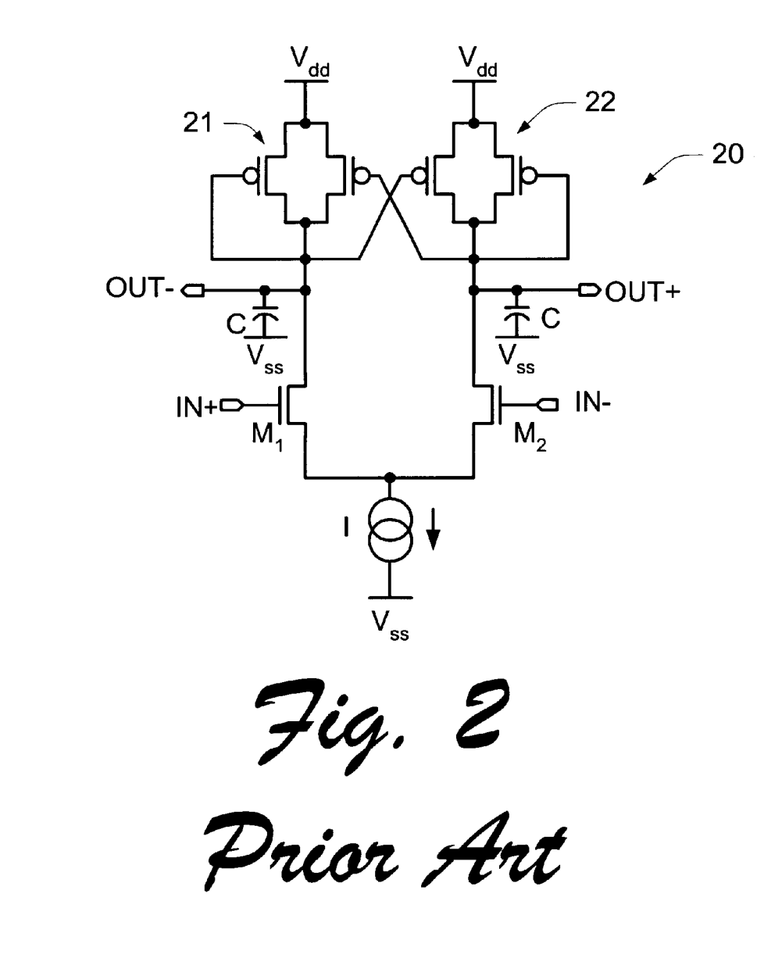

FIG. 2 shows a prior art duty cycle integrator 20 having an active load. Transistors $M_1$ and $M_2$ are connected as in FIG. 1, except that a current source I is connected between $V_{ss}$ and the common sources of the transistors. The load comprises two pairs 21 and 22 of p-channel MOSFETs. Each pair has its drains connected in common to the drain of a corresponding one of transistors $M_1$ and $M_2$, and its sources connected in common to $V_{dd}$. Within each pair, the gate of one transistor is tied to the drain of the corresponding one of differential transistors $M_1$ and $M_2$, while the gate of the other transistor is tied to the drain of the other, opposing one of differential transistors $M_1$ and $M_2$. For example, of the pair 21, one transistor has its gate tied to the drain of differential transistor $M_1$, while the other transistor has its gate tied to the drain of differential transistor $M_2$.

This load is advantageous in certain situations because it exhibits a very low common mode impedance and a very high differential impedance.

A load such as this is described in U.S. Pat. No. 5,422,529, entitled "Differential Charge Pump Circuit With High Differential and Low Common Mode Impedance," which states that the described load eliminates the need for common mode feedback.

DETAILED DESCRIPTION

The following description sets forth a specific embodiment that incorporates elements recited in the appended claims. The embodiment is described with specificity in order to meet statutory requirements. However, the description itself is not intended to limit the scope of this patent. Rather, the inventors have contemplated that the claimed invention might also be embodied in other ways, to include different elements or combinations of elements similar to the ones described in this document, in conjunction with other present or future technologies.

Figure 3:
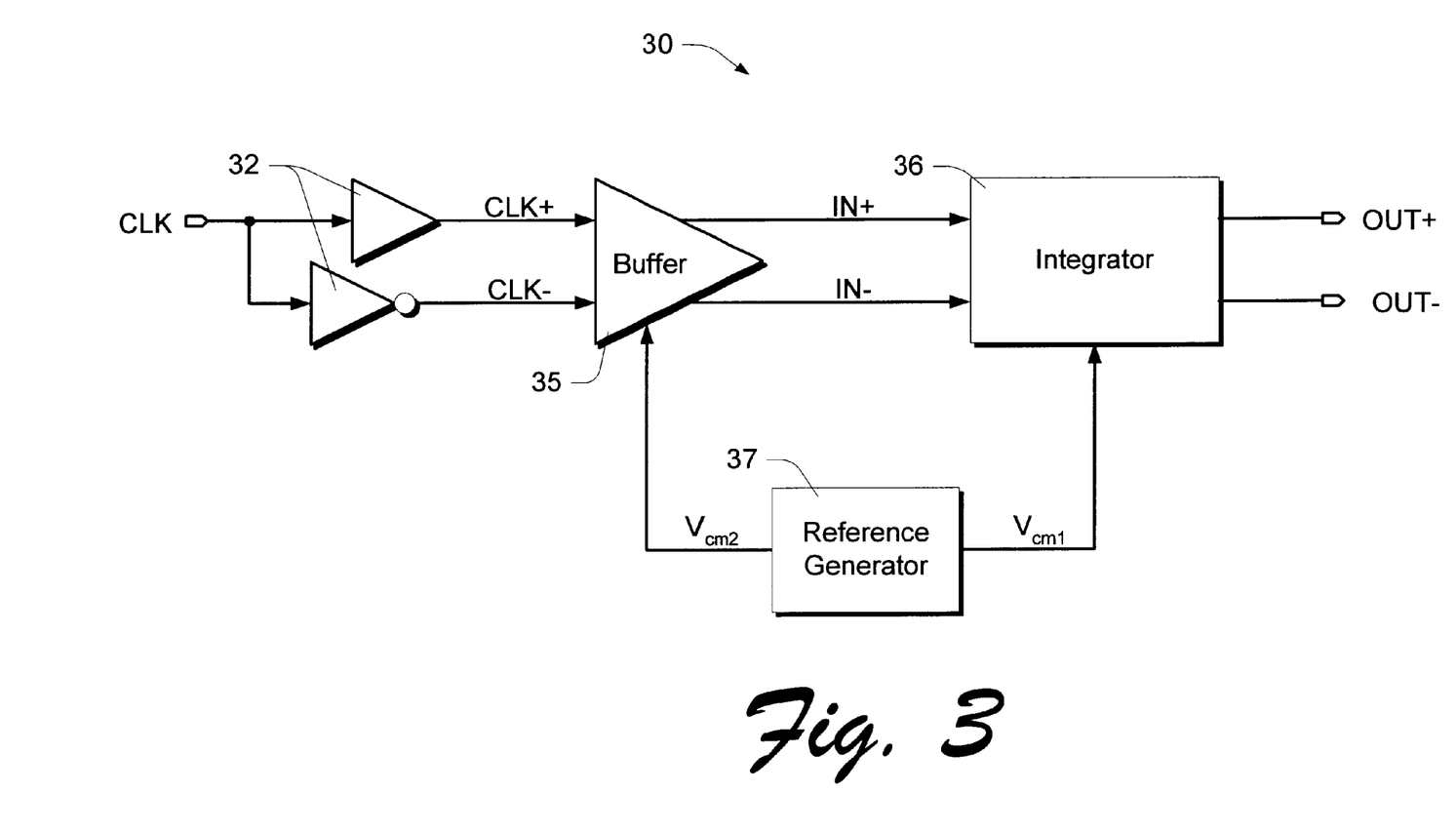
FIG. 3 is a schematic diagram of a duty cycle integrator.

FIG. 3 shows a clock duty cycle integration circuit 30, also referred to herein as a duty cycle detection circuit. The circuit receives a clock input CLK and produces a differential output signal OUT that comprises a pair of differential voltages OUT+ and OUT−.

Detection circuit 30 has inverters and/or buffers 32 that receive the CLK signal and in response produce complementary, full-swing clock inputs CLK+ and CLK−. Inverters and/or buffers 32 are configured to maintain an accurate phase relationship between CLK+ and CLK− so that CLK+ is on when CLK− is off and vise versa.

Detection circuit 30 also has reference generation circuit 37. Reference generation circuit 37 produces biasing voltages $V_{cm1}$ and $V_{cm2}$ that control the common mode voltages of the differential input signal IN and of the differential output signal OUT, respectively.

Detection circuit 30 also has reference generation circuit 40. Reference generation circuit 40 produces biasing voltages $V_{cm1}$ and $V_{cm2}$ that control the common mode voltages of the differential input signal IN and of the differential output signal OUT, respectively.

Figure 4:
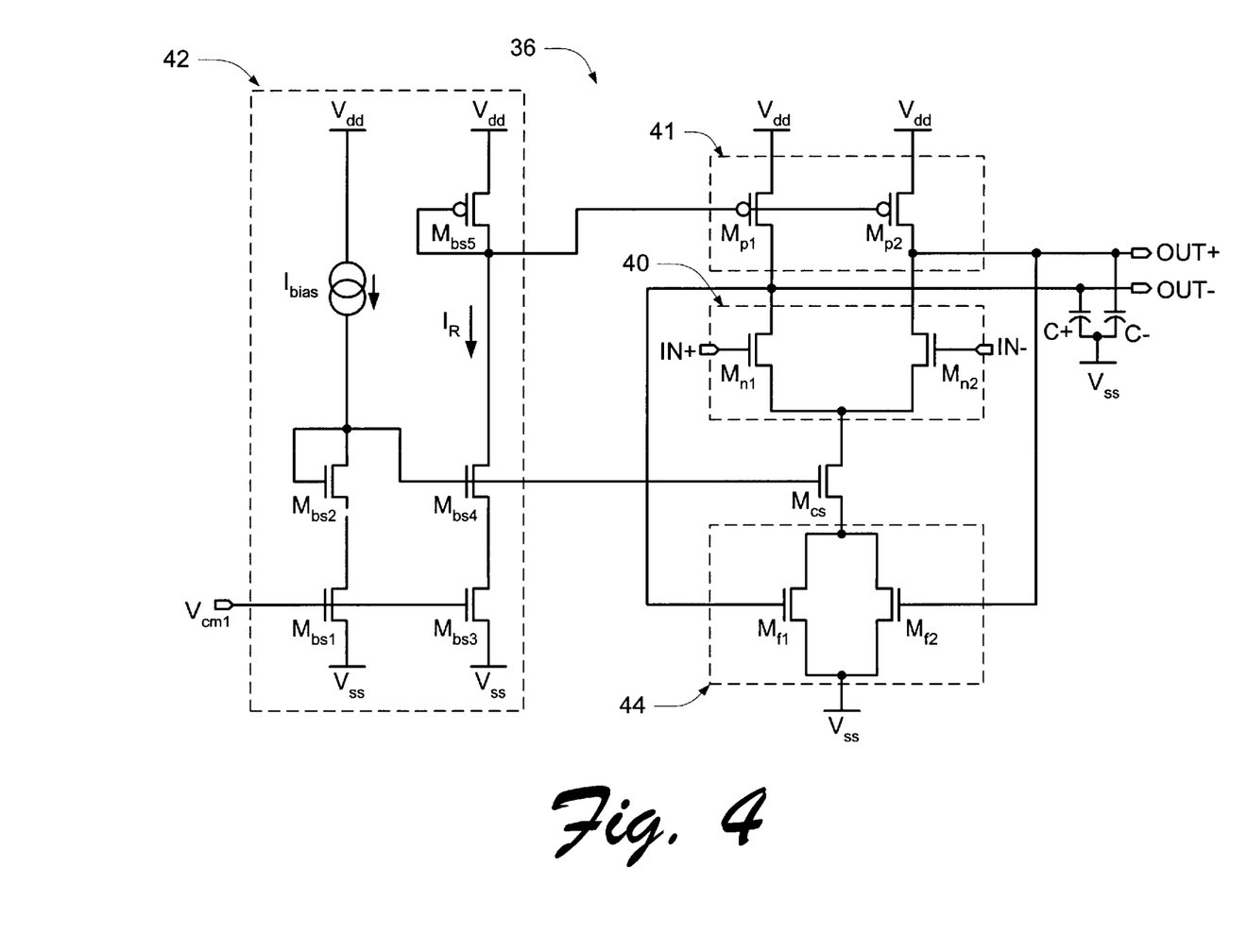
FIG. 4 is a schematic diagram of an integrator circuit.

FIG. 4 shows an implementation of integrator circuit 36, which is fabricated in this example using CMOS technology. The circuit comprises a differential pair 40 formed by n-channel MOSFET transistors $M_{n1}$ and $M_{n2}$. The gates of these transistors are connected to receive the input voltages IN+ and IN−, respectively, of the differential input signal produced by buffer 35. The drains of $M_{n1}$ and $M_{n2}$ are connected to a load 41 and to capacitances C+ and C−, respectively. The capacitances integrate the output current of differential pair 40, to produce differential output signal OUT.

The load 41 associated with differential transistors $M_{n1}$ and $M_{n2}$ comprises a pair of matching current source transistors $M_{p1}$ and $M_{p2}$. These are p-channel MOSFETs connected in series with the respective differential transistors $M_{n1}$ and $M_{n2}$. Specifically, each of transistors $M_{p1}$ and $M_{p2}$ has its source connected to upper supply voltage $V_{dd}$ and its drain connected to the drain of one of differential transistors $M_{n1}$ and $M_{n2}$.

Load transistors $M_{p1}$ and $M_{p2}$ are configured to mirror a reference current that is established by a biasing circuit 42.

Biasing circuit 42 includes a current source $I_{bias}$ and transistors $M_{bs1}$, $M_{bs2}$, $M_{bs3}$, $M_{bs4}$, and $M_{bs5}$. $M_{bs1}$, $M_{bs2}$, $M_{bs3}$, and $M_{bs4}$ are n-channel MOSFETs, while $M_{bs5}$ is a p-channel MOSFET.

Transistor $M_{bs5}$ is configured as a current mirror transistor with load transistors $M_{p1}$ and $M_{p2}$: the gates of all three transistors are connected in common to the drain of transistor $M_{bs5}$ while the sources of all three transistors are connected to $V_{dd}$. Each one of transistors $M_{p1}$ and $M_{p2}$ is half the width of transistor $M_{bs5}$. Thus, load transistors $M_{p1}$ and $M_{p2}$ mirror half of the reference current $I_R$ that flows through transistor $M_{bs5}$.

Reference current $I_R$ is established through transistor $M_{bs5}$ as follows. Current source $I_{bias}$, transistor $M_{bs2}$ and transistor $M_{bs1}$ are connected in series: $I_{bias}$ flows between $V_{dd}$ and the drain of $M_{bs2}$; the source of $M_{bs2}$ is connected to the drain of $M_{bs1}$, and the source of $M_{bs1}$ is connected to $V_{ss}$. Thus, the current through $M_{bs1}$ and $M_{bs2}$ is equal to $I_{bias}$.

Transistor $M_{bs4}$ is configured to act as a current source in series with transistor $M_{bs5}$, to establish a reference current $I_R$ through $M_{bs5}$. Specifically, the drain of transistor $M_{bs4}$ is connected to the drain of transistor $M_{bs5}$; the source of transistor Mbs4 is connected to the drain of transistor $M_{bs3}$, and the source of transistor $M_{bs3}$ is connected to $V_{ss}$. The gate of transistor $M_{bs4}$ is connected to both the drain and the gate of transistor $M_{bs2}$. Accordingly, transistor $M_{bs4}$ mirrors transistor $M_{bs2}$, and establishes a current $I_R = I_{bias}$ through transistor $M_{bs5}$.

Transistors $M_{bs1}$ and $M_{bs3}$ are controlled by a reference voltage $V_{cm1}$ connected to their gates, and function as references to common mode feedback circuitry described below. $V_{cm1}$ is supplied from reference generator 37 (FIG. 3). Transistors $M_{bs1}$ and $M_{bs3}$ are configured to operate in their linear region.

Load transistors $M_{p1}$ and $M_{p2}$ are mirrors of transistor $M_{bs5}$, and therefore source a total current $I_{bias}$ to output nodes OUT+ and OUT−. In addition, an n-channel transistor $M_{cs}$ is connected in series with the common sources of differential transistors $M_{n1}$ and $M_{n2}$. Transistor $M_{cs}$ is connected to mirror whatever current flows through transistor Mbs4, and therefore establishes a current $I_R = Ibias$ that is allowed to flow differentially through transistors $M_{n1}$ and $M_{n2}$.

Integrator circuit 36 further comprises common mode feedback circuitry 44 that controls the common mode output voltage of integrator circuit 36. Common mode feedback circuitry 44 is responsive to reference voltage $V_{cm1}$ and to the common mode voltage of differential output signal OUT to minimize the difference between the common mode voltage and the reference voltage. The common mode output voltage is defined as the average voltage of OUT+ and OUT−.

Common mode feedback circuitry 44 includes a pair of n-channel MOSFET transistors $M_{f1}$ and $M_{f2}$ connected in parallel with each other and in series with differential pair 40. Transistors $M_{f1}$ and $M_{f2}$ are controlled by the differential output signal of differential pair 40 to establish a desired common mode output voltage. These transistors, like reference transistors $M_{bs1}$ and $M_{bs3}$, are configured to operate in their linear region.

More specifically, the drains of transistors $M_{f1}$ and $M_{f2}$ are connected in common to the sources of differential transistors $M_{n1}$ and $M_{n2}$ through the source-drain channel of the current-source transistor $M_{cs}$. The sources of transistors $M_{f1}$ and $M_{f2}$ are connected in common to $V_{ss}$. The gate of transistor $M_{f1}$ is connected to the differential output voltage OUT+ and the gate of transistor $M_{f2}$ is connected to the differential output voltage OUT−.

In conjunction with the differential pair 40 and load elements $M_{p1}$ and $M_{p2}$, feedback transistors $M_{f1}$ and $M_{f2}$ function similarly to transistors $M_{bs1}$ and $M_{bs3}$ in biasing circuit 42. The gates of $M_{bs1}$ and $M_{bs3}$ are connected to reference voltage $V_{cm1}$. The remaining voltages of biasing circuit 42 assume whatever values are necessary to maintain $I_R$ equal to $I_{bias}$. Specifically, the voltage at the gate of transistor $M_{bs5}$ will be such that $M_{bs5}$ will pass currents equal to $I_R$ or $I_{bias}$.

For the circuit to maintain equilibrium, feedback transistors $M_{f1}$ and $M_{f2}$ should also pass a total current equal to $I_R$ or $I_{bias}$. Since $M_{f1}$ and $M_{f2}$ are in positions similar to that of transistors $M_{bs1}$ and $M_{bs3}$, $M_{f1}$ and $M_{f2}$ need gate voltages equal to $V_{cm1}$ to pass $I_R$ or $I_{bias}$. Accordingly, and since the gates of these transistors are connected to the differential outputs OUT+ and OUT−, a common mode output voltage that is higher than $V_{cm1}$ will cause feedback transistors $M_{f1}$ and $M_{f2}$ to conduct a current greater than $I_R$, which will over time lower the common mode output voltage. A common mode output voltage that is lower than $V_{cm1}$ will cause feedback transistors $M_{f1}$ and $M_{f2}$ to conduct a current less than $I_R$, which will over time increase the common mode output voltage. This feedback mechanism, therefore, keeps the common mode voltage equal to $V_{cm1}$.

It is desirable to provide for as much voltage swing as possible in the differential output signal OUT. Thus, $V_{cm1}$, which corresponds to the common mode output voltage, is set at a value approximately midway between the possible voltage extremes of OUT+ and OUT−.

In the circuit of FIG. 4, the upper value of the OUT+ and OUT− signals is desirably limited to the highest voltage at which load transistors $M_{p1}$ and $M_{p2}$ remain in their saturation regions and therefore behave as approximately ideal current sources. This highest voltage is equal to $V_{dd} - V_{SAT}$, where the saturation voltage $V_{SAT}$ is the lowest drain to source voltage at which a transistor remains in its saturation region. $V_{SAT}$ is typically defined as $V_{GS} - V_T$, where $V_{GS}$ is the gate to source voltage of the transistor and $V_T$ is the voltage threshold of the transistor. In this case, $V_{GS}$ can be made quite low—e.g. 100 mV above $V_T$. As a result, the circuit of FIG. 4 permits a relatively high upper limit on the differential output voltages OUT+ and OUT−. This is a highly desirable characteristic in modern integrated circuits where supply voltages are decreased as much as possible to accommodate fine transistor geometry.

To further exploit the relatively high upper voltage limit of the differential output voltages, it is desirable to generate $V_{cm1}$ in a way such that it varies with the supply voltage $V_{dd}$ and saturation voltage $V_{SAT}$. In the described embodiment, this is accomplished by varying $V_{cm1}$ as a function of $V_{dd}$ and $V_{TP}$, where $V_{TP}$ is the voltage threshold of p-channel MOSFETs used in the circuit. Specifically, $V_{cm1}$ is generated such that it varies directly with $V_{dd}$ and in proportion to $V_{TP}$.

Figure 5:
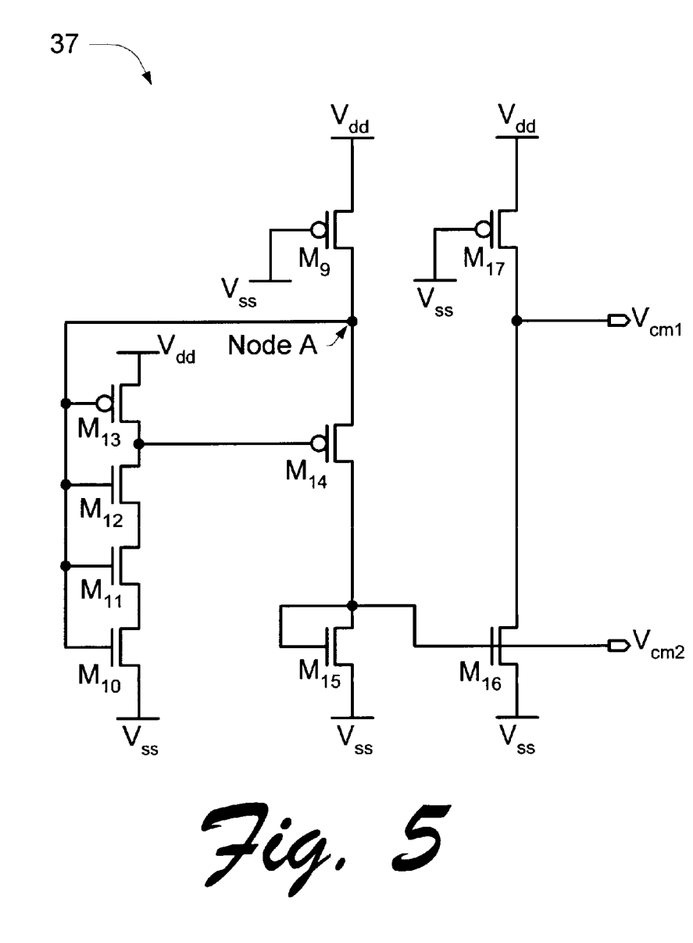
FIG. 5 is a block diagram of a reference generator circuit.

FIG. 5 shows an exemplary implementation of a reference generator 37 that generates reference voltage $V_{cm1}$ and that varies $V_{cm1}$ as a function of a p-channel voltage threshold. The circuit includes a p-channel load transistor $M_9$ and a series of transistors $M_{10}$, $M_{11}$, $M_{12}$, $M_{13}$ and $M_{14}$ that are connected to establish a voltage at node A that is equal to $V_{dd} - V_{TP}$, where $V_{TP}$ is the characteristic voltage threshold of p-channel transistors used in the implementation of the duty cycle integrator.

Transistors $M_{10}$, $M_{11}$ and $M_{12}$ are n-channel MOSFETs whose sources and drains are connected in series from $V_{ss}$ to the drain of transistor M13. Transistor $M_{13}$ is a p-channel MOSFET whose source is connected to $V_{dd}$. The gates of transistors $M_{10}$, $M_{11}$, $M_{12}$ and $M_{13}$ are connected together and to node A. The source of load transistor $M_9$ is connected to $V_{dd}$ and its drain is connected to node A. The gate of load transistor $M_9$ is connected to $V_{ss}$.

Transistor $M_{14}$ is a p-channel MOSFET whose gate is connected to the drain of transistor $M_{13}$. The source of transistor $M_{14}$ is connected to node A. The drain of transistor $M_{14}$ is connected through the drain and source of an n-channel MOSFET $M_{15}$ to $V_{ss}$.

$M_{10}$, $M_{11}$, and $M_{12}$ are very weak transistors compared to transistor $M_{13}$. Therefore, transistors $M_{10}$, $M_{11}$, and $M_{12}$ can be viewed as a very large resistor. When the voltage at Node A is greater than $V_{dd}-V_{TP}$, transistor $M_{13}$ is off and transistors $M_{10}$, $M_{11}$, and $M_{12}$ are on. This pulls the gate of transistor $M_{14}$ low to increase the current flowing through transistor $M_9$, thereby decreasing the voltage of node A. When the voltage at Node A is less than $V_{dd}-V_{TP}$, Transistors $M_{13}$, $M_{10}$, $M_{11}$, and $M_{12}$ are all on. Because transistors $M_{10}$, $M_{11}$, and $M_{12}$ are equivalent to a very large resistor, transistor $M_{13}$ only needs to be weakly turned on to pull the gate of transistor $M_{14}$ high to decrease the current flowing through transistor $M_9$, thereby increasing the voltage of node A. At equilibrium, therefore, the voltage at node A will be maintained at $V_{dd}-V_{TP}$. Furthermore, the current through $M_9$ will be inversely proportional to $V_{TP}$.

Transistors $M_{16}$ and $M_{17}$ are configured in a current branch between $V_{dd}$ and $V_{ss}$ that parallels the branch established by transistors $M_{15}$, $M_{14}$, and $M_9$. Transistor $M_{16}$ is configured to mirror the current that flows through transistor $M_{15}$—the gates of transistors $M_{15}$ and $M_{16}$ are connected to each other and to the drain of transistor $M_{15}$. The source of transistor $M_{16}$ is connected to $V_{ss}$ and the drain of transistor $M_{16}$ is connected to the drain of transistor $M_{17}$. The source of transistor $M_{17}$ is connected to $V_{dd}$, and the gate of transistor $M_{17}$ is connected to $V_{ss}$.

Because of the current mirror between transistors $M_{15}$ and $M_{16}$, the currents through transistors $M_9$ and $M_{17}$ are the same and are inversely proportional to $V_{TP}$. Accordingly, if these transistors are fabricated to be the same size they will drop the same voltage and $V_{cm1}$, the voltage at the drain of transistor $M_{17}$, will equal the voltage at node A. It is also possible through this circuit to set $V_{cm1}$ at arbitrary voltages below or above node A by choosing an appropriate size ratio between transistor $M_{17}$ and transistor $M_9$. Furthermore, because the current through both $M_9$ and $M_{17}$ is inversely proportional to $V_{TP}$, reference voltage $V_{cm1}$ varies in proportion to $V_{TP}$. Note that $M_9$ and $M_{17}$ could be replaced by resistors if available 15 in the fabrication process used to create the circuits.

In the described embodiment, $M_9$ and $M_{17}$ are sized to set $V_{cm1}$ at approximately $V_{dd}-V_{SAT}-V_{SW}/2$, where $V_{SAT}$ is the saturation voltage of transistors $M_{p1}$ and $M_{p2}$ of FIG. 4, and $V_{SW}$ is the desired voltage swing of the differential outputs OUT+ and OUT−. Because $V_{cm1}$ tracks $V_{TP}$, and because $V_{SAT}$ is a function of $V_{TP}$, the common mode output voltage will track $V_{SAT}$, ensuring that load transistors $M_{p1}$ and $M_{p2}$ remain in saturation in spite of process, voltage, and temperature variations.

Figure 6:
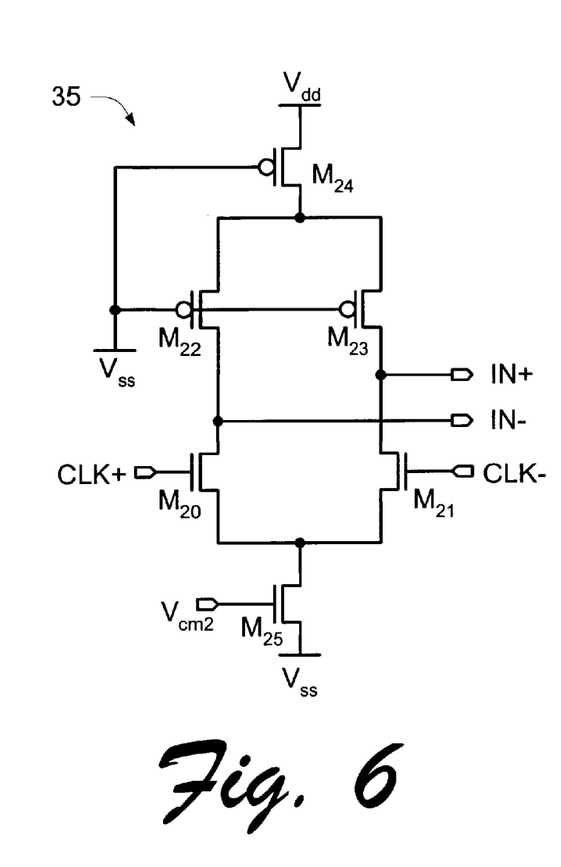
FIG. 6 is a block diagram of a buffer circuit.

FIG. 6 shows an exemplary implementation of a buffer 35. This circuit receives complementary clock inputs CLK+ and CLK− and produces differential input signals IN+ and IN− that are in turn received by the integrator circuit 36 of FIG. 4. Buffer 35 is designed to control the common mode voltage of IN+ and IN− and to vary this common mode voltage as a function of $V_{TP}$. Varying the common mode voltage with $V_{TP}$ ensures that differential transistors $M_{n1}$ and $M_{n2}$ remain in saturation over process, voltage, and temperature variations.

Buffer 35 comprises a simple differential amplifier having a differential pair of n-channel transistors $M_{20}$ and $M_{21}$, configured through a T-resistor load formed by transistors $M_{22}$, $M_{23}$, and $M_{24}$. The bias of the differential pair is established by an n-channel bias transistor $M_{25}$ that is connected as a current mirror of transistor $M_{15}$ of FIG. 5. Accordingly, the bias current through the differential pair $M_{20}$ and $M_{21}$ will vary inversely in proportion to $V_{TP}$, and both the common mode voltage and the high voltage levels of IN+ and IN− will vary directly in proportion to $V_{TP}$.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A duty cycle integrator comprising:
    a differential component that is responsive to complementary clock inputs to produce a differential output signal;
    capacitance that integrates the differential output signal to produce an integrated differential output signal representing the duty cycle of the complementary clock inputs, the integrated differential output signal having a common mode output voltage; and
    common mode feedback circuitry associated with the differential component to control the common mode output voltage in response to a received reference voltage.

2. A duty cycle integrator as recited in claim 1, wherein the differential component comprises field effect transistors.

3. A duty cycle integrator as recited in claim 1, wherein the common mode feedback circuitry comprises a pair of parallel transistors connected in series with the differential component, wherein the parallel transistors are controlled by the differential output signal.

4. A duty cycle integrator as recited in claim 1, further comprising a reference generator that generates the reference voltage and that varies the reference voltage as a function of a transistor voltage threshold.

5. A duty cycle integrator as recited in claim 1, further comprising an input buffer that establishes a common mode input voltage to the differential component and that varies the common mode input voltage as a function of a transistor voltage threshold.

6. A duty cycle integrator as recited in claim 1 further comprising:
    a reference generator that generates the reference voltage and that varies the reference voltage as a function of a transistor voltage threshold; and
    an input buffer that establishes a common mode input voltage to the differential component and that varies the common mode input voltage as a function of a transistor voltage threshold.

7. A duty cycle integrator comprising:
    a differential component that is responsive to complementary clock inputs to produce a differential output signal;
    capacitance that integrates the differential output signal to produce an integrated differential output signal representing the duty cycle of the complementary clock inputs, the integrated differential output signal having a common mode output voltage; and common mode feedback circuitry associated with the differential component to control the common mode output voltage in response to a received reference voltage, wherein the differential component comprises a differential pair of transistors, the duty cycle integrator further comprising:
a current source that establishes a reference current;
a pair of mirrored transistors connected respectively in series with the transistors of the differential pair to mirror the reference current; and
the common mode feedback circuitry comprising a pair of parallel transistors connected in series with the differential component, wherein the parallel transistors are controlled by the differential output signal.

8. A duty cycle integrator comprising:
a differential component that is responsive to complementary clock inputs to produce a differential output signal;
capacitance that integrates the differential output signal to produce an integrated differential output signal representing the duty cycle of the complementary clock inputs, the integrated differential output signal having a common mode output voltage; and
common mode feedback circuitry associated with the differential component to control the common mode output voltage in response to a received reference voltage, wherein the differential component comprises a differential pair of transistors, the duty cycle integrator further comprising:
a reference transistor that is controlled by the received reference voltage;
a current source that establishes a reference current through the reference transistor;
a pair of mirrored transistors connected respectively in series with the transistors of the differential pair to mirror the reference current; and
the common mode feedback circuitry comprising a pair of parallel transistors connected in series with the differential component, wherein the parallel transistors are controlled by the differential output signal to establish the common mode output voltage in accordance with the received reference voltage.

9. A duty cycle integrator comprising:
a differential component that is responsive to complementary clock inputs to produce a differential output signal;
capacitance that integrates the differential output signal to produce an integrated differential output signal representing the duty cycle of the complementary clock inputs, the integrated differential output signal having a common mode output voltage; and
common mode feedback circuitry associated with the differential component to control the common mode output voltage in response to a received reference voltage, wherein the differential component comprises a differential pair of transistors, the duty cycle integrator further comprising:
a reference transistor that is controlled by the received reference voltage;
a current mirror transistor connected in series with the reference transistor, the current mirror transistor having a source connected to a supply voltage, the current mirror transistor having a gate and a drain that are connected to each other;
a current source that establishes a reference current through the reference transistor and through the current mirror transistor;
a pair of mirrored transistors having gates that are connected to the gate of the current mirror transistor to mirror the reference current, the mirrored transistors being connected respectively between the supply voltage and the transistors of the differential pair; and
the common mode feedback circuitry comprising a pair of parallel transistors connected in series with the differential component, wherein the parallel transistors are controlled by the differential output signal to establish the common mode output voltage in accordance with the received reference voltage.

10. A duty cycle integrator comprising:
a differential pair of transistors that is responsive to complementary clock inputs to produce a differential output signal;
capacitance that integrates the differential output signal to produce an integrated differential output signal representing the duty cycle of the complementary clock inputs, the integrated differential output signal having a common mode output voltage;
a reference transistor that is controlled by a received reference voltage;
a current source that establishes a reference current through the reference transistor;
a pair of mirrored transistors connected respectively in series with the transistors of the differential pair to mirror the reference current; and
a pair of parallel transistors connected in series with the differential transistor pair, wherein the parallel transistors are controlled by the differential output signal to establish the common mode output voltage in accordance with the received reference voltage.

11. A duty cycle integrator as recited in claim 10, wherein the mirrored transistors each have a transistor voltage threshold, the duty cycle integrator further comprising a reference generator that generates the reference voltage and that varies the reference voltage as a function of said transistor voltage threshold.

12. A duty cycle integrator as recited in claim 10, wherein the duty cycle integrator further comprises an input buffer that establishes a common mode input voltage to the differential pair of transistors and that varies the common mode input voltage as a function of a transistor voltage threshold.

13. A duty cycle integrator as recited in claim 10, further comprising:
a reference generator that generates the reference voltage and that varies the reference voltage as a function of a transistor voltage threshold; and
an input buffer that establishes a common mode input voltage to the differential pair of transistors and that varies the common mode input voltage as a function of the transistor voltage threshold.

14. An electrical circuit comprising:
a differential component that is responsive to a differential input signal to produce a differential output signal, the input signal having a common mode input voltage and the output signal having a common mode output voltage;
common mode feedback circuitry associated with the differential component to control the common mode output voltage;
wherein the common mode feedback circuitry varies the common mode output voltage in accordance with a transistor voltage threshold;
an input buffer that controls the common mode input voltage; and
wherein the input buffer varies the common mode input voltage as a function of said transistor voltage threshold.

15. An electrical circuit as recited in claim 14, wherein the input buffer varies the common mode input voltage in proportion to the transistor voltage threshold.

16. An electrical circuit as recited in claim 14, wherein the common mode feedback circuitry varies the common mode output voltage in proportion to the transistor voltage threshold.

17. An electrical circuit as recited in claim 14, wherein the differential component comprises one or more transistors having one or more electrical characteristics that vary as a function of the transistor voltage threshold.

18. An electrical circuit as recited in claim 14, wherein the differential component comprises a differential pair of transistors having one or more electrical characteristics that vary as a function of the transistor voltage threshold.

19. An electrical circuit as recited in claim 14, wherein the common mode feedback circuitry comprises one or more transistors having one or more electrical characteristics that vary as a function of the transistor voltage threshold.

20. An electrical circuit as recited in claim 14, further comprising one or more transistors configured as current mirrors, wherein said one or more transistors have one or more electrical characteristics that vary as a function of the transistor voltage threshold.

21. An electrical circuit as recited in claim 14, further comprising:
   a current mirror transistor having a source connected to a supply voltage, the current mirror transistor having a gate and a drain that are connected to each other;
   a current source that establishes a reference current through the current mirror transistor;
   a pair of mirrored transistors having gates, that are connected to the gate of the current mirror transistor to mirror the reference current, the mirrored transistors being connected between the supply voltage and the differential component; and
   wherein the mirrored transistors have one or more electrical characteristics that vary as a function of the transistor voltage threshold.

22. An electrical circuit comprising:
   a differential component that produces a differential output signal having a common mode output voltage;
   a reference generator that generates a reference voltage and that varies the reference voltage as a function of a transistor voltage threshold; and
   common mode feedback circuitry associated with the differential component to control the common mode output voltage in accordance with the reference voltage.

23. An electrical circuit as recited in claim 22, wherein the reference generator varies the reference voltage in proportion to the transistor voltage threshold.

24. An electrical circuit as recited in claim 22, further comprising one or more transistors having one or more electrical characteristics that vary as a function of the transistor voltage threshold.

25. An electrical circuit as recited in claim 22, further comprising one or more transistors configured as current mirrors, wherein said one or more transistors have one or more electrical characteristics that vary as a function of the transistor voltage threshold.

26. An electrical circuit as recited in claim 22, further comprising one or more transistors configured as current mirrors, wherein said one or more transistors have saturation voltages that vary as a function of the transistor voltage threshold.

27. An electrical circuit as recited in claim 22, further comprising:
   a current mirror transistor having a source connected to a supply voltage, the current mirror transistor having a gate and a drain that are connected to each other;
   a current source that establishes a reference current through the current mirror transistor;
   a pair of mirrored transistors having gates that are connected to the gate of the current mirror transistor to mirror the reference current, the mirrored transistors being connected between the supply voltage and the differential component; and
   wherein the mirrored transistors have one or more electrical characteristics that vary as a function of the transistor voltage threshold.

28. An electrical circuit comprising:
   a differential component that is responsive to a differential input signal to produce a differential output signal, the input signal having a common mode input voltage and the output signal having a common mode output voltage;
   common mode feedback circuitry associated with the differential component to control the common mode output voltage;
   an input buffer that controls the common mode input voltage; and
   wherein the input buffer varies the common mode input voltage as a function of a transistor voltage threshold.

29. An electrical circuit as recited in claim 28, wherein the input buffer varies the common mode input voltage in proportion to the transistor voltage threshold.

30. An electrical circuit as recited in claim 28, wherein the differential component comprises one or more transistors having one or more electrical characteristics that vary as a function of the transistor voltage threshold.

31. An electrical circuit as recited in claim 28, wherein the differential component comprises a differential pair of transistors having one or more electrical characteristics that vary as a function of the transistor voltage threshold.

32. An electrical circuit as recited in claim 28, wherein the differential component comprises a differential pair of transistors having saturation voltages that vary as a function of the transistor voltage threshold.

33. In an electrical circuit that produces a differential output voltage having a common mode output voltage, a method comprising;
   generating a reference voltage;
   varying the reference voltage in accordance with a transistor voltage threshold; and
   controlling the common mode output voltage in accordance with the reference voltage.

34. A method to produce an output signal representing a duty cycle of two complementary clock inputs comprising:
   receiving the two complementary clock inputs;
   producing a differential output signal based on the two complementary clock inputs;
   integrating the differential output signal to an output signal having a common mode output voltage; and
   controlling the common mode output voltage in response to a received reference voltage.

35. The method of claim 34 wherein a differential component receives the complementary clock inputs.

* * * * *

UNITED STATES PATENT AND TRADEMARK OFFICE
CERTIFICATE OF CORRECTION

PATENT NO. : 6,573,779 B2
DATED : June 3, 2003
INVENTOR(S) : Sidiropoulos et al.

It is certified that error appears in the above-identified patent and that said Letters Patent is hereby corrected as shown below:

<u>Column 5,</u>
Line 50, delete "15" between "available" and "in".

<u>Column 6,</u>
Line 58, replace "conf igured" with -- configured --.

Signed and Sealed this

Twenty-fifth Day of November, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,573,779 B2
DATED : June 3, 2003
INVENTOR(S) : Sidiropoulos et al.

It is certified that error appears in the above-identified patent and that said Letters Patent is hereby corrected as shown below:

<u>Column 2,</u>
Line 36, insert -- Detection circuit 30 further comprises an input buffer circuit 35 that converts the full-swing signals CLK+ and CLK- to a differential low-swing clock signal IN having individual components IN+ and IN-. An intergrator circuit 36 receives the differential input signal IN and in response produces a differential output voltage OUT having individual components OUT+ and OUT-. --.
Lines 41 through 45, delete the paragraph "Detection circuit 30 also has reference generation circuit 40. Reference generation circuit 40 produces biasing voltages V cm1 and V cm2 that control the common mode voltages of the differential input signal IN and of the differential output signal OUT, respectively.".

Signed and Sealed this

Sixth Day of April, 2004

JON W. DUDAS
*Acting Director of the United States Patent and Trademark Office*